United States Patent
Lu

(10) Patent No.: US 12,406,855 B2
(45) Date of Patent: Sep. 2, 2025

(54) METHOD FOR PREPARING SEMICONDUCTOR DEVICE STRUCTURE WITH ENERGY REMOVABLE SPACERS

(71) Applicant: NANYA TECHNOLOGY CORPORATION, New Taipei (TW)

(72) Inventor: Li-Han Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 477 days.

(21) Appl. No.: 17/669,547

(22) Filed: Feb. 11, 2022

(65) Prior Publication Data

US 2023/0260799 A1    Aug. 17, 2023

(51) Int. Cl.
H01L 21/311    (2006.01)

(52) U.S. Cl.
CPC ... *H01L 21/31144* (2013.01); *H01L 21/31111* (2013.01); *H01L 21/31116* (2013.01); *H01L 21/31127* (2013.01)

(58) Field of Classification Search
None
See application file for complete search history.

(56) References Cited

U.S. PATENT DOCUMENTS

| | | | | |
|---|---|---|---|---|
| 9,484,202 | B1* | 11/2016 | Zhou | H01L 21/0337 |
| 2013/0252431 | A1* | 9/2013 | Chen | H10D 30/024 |
| | | | | 257/E21.249 |
| 2014/0045124 | A1* | 2/2014 | Park | H01L 21/31144 |
| | | | | 430/319 |
| 2016/0181100 | A1* | 6/2016 | deVilliers | H01L 21/0337 |
| | | | | 438/702 |
| 2018/0151363 | A1* | 5/2018 | Su | H01L 21/0337 |
| 2019/0035677 | A1* | 1/2019 | Chandhok | H01L 21/0337 |
| 2021/0367063 | A1* | 11/2021 | Kao | H01L 21/02167 |

FOREIGN PATENT DOCUMENTS

| | | |
|---|---|---|
| CN | 102224569 A | 10/2011 |
| CN | 103578970 A | 2/2014 |
| TW | 201735155 A | 10/2017 |
| TW | 202101596 A | 1/2021 |

OTHER PUBLICATIONS

Office Action and Search Report mailed on Jan. 5, 2023 related to Taiwanese Application No. 111116059.

* cited by examiner

*Primary Examiner* — Sue A Purvis
*Assistant Examiner* — Seyon Ali-Simah Punchbeddell
(74) *Attorney, Agent, or Firm* — Xuan Zhang

(57) ABSTRACT

A method for preparing a semiconductor device structure includes forming a target layer over a semiconductor substrate, and forming a plurality of first mask patterns over the target layer. The method also includes forming a plurality of energy removable spacers on opposite sidewalls of each of the first mask patterns, and forming a second mask pattern over the target layer and between the energy removable spacers. The method further includes removing the energy removable spacers, and etching the target layer using the first mask patterns and the second mask pattern as a mask.

18 Claims, 20 Drawing Sheets

METHOD FOR PREPARING SEMICONDUCTOR DEVICE STRUCTURE WITH ENERGY REMOVABLE SPACERS

TECHNICAL FIELD

The present disclosure relates to a method for preparing a semiconductor device structure, and more particularly, to a method for preparing a semiconductor device structure with energy removable spacers to form fine-pitch patterns.

DISCUSSION OF THE BACKGROUND

As semiconductor device structures become smaller and highly integrated, a number of technologies for fabricating fine patterns for semiconductor device structures have been developed. Particularly, photolithography process is typically used to fabricate electronic and optoelectronic devices on a substrate, and photoresist patterns prepared by the photolithography process are used as masks in etching or ion implantation processes. As the required pitch size and critical dimension (CD) continue to shrink, the fineness of the photoresist patterns becomes a very important factor in determining the degree of integration. However, photolithographic processes for fabricating semiconductor features have appeared a limitation in the resolution of the exposure apparatus.

Although existing semiconductor device structures with fine-pitch patterns and methods for manufacturing the same have been adequate for their intended purposes, they have not been entirely satisfactory in all respects. Therefore, up to the present, there are still some problems to be overcome in regards to the technologies of forming semiconductor device structures with fine-pitch patterns.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for preparing a semiconductor device structure is provided. The method includes forming a target layer over a semiconductor substrate, and forming a plurality of first mask patterns over the target layer. The method also includes forming a plurality of energy removable spacers on opposite sidewalls of each of the first mask patterns, and forming a second mask pattern over the target layer and between the energy removable spacers. The method further includes removing the energy removable spacers, and etching the target layer using the first mask patterns and the second mask pattern as a mask.

In an embodiment, the energy removable spacers are in direct contact with the target layer. In an embodiment, the energy removable spacers are in direct contact with the opposite sidewalls of each of the first mask patterns. In an embodiment, the second mask pattern is in direct contact with the target layer. In an embodiment, the second mask pattern is formed between the first mask patterns and in direct contact with the energy removable spacers. In an embodiment, the second mask pattern is separated from the first mask patterns by the energy removable spacers.

In an embodiment, top surfaces of the first mask patterns, the second mask pattern, and the energy removable spacers are substantially coplanar. In an embodiment, the energy removable spacers are removed after the second mask pattern is formed. In an embodiment, the target layer is etched after the energy removable spacers are removed. In an embodiment, the first mask patterns and the second mask pattern are removed after the target layer is etched. In an embodiment, after the target layer is etched, the target layer has a plurality of protruding portions extending upward from a base portion of the target layer, and a first pitch between the first mask patterns is greater than a second pitch between the protruding portions of the target layer.

In an embodiment, the formation of the energy removable spacers includes forming an energy removable layer conformally covering the target layer and the first mask patterns, performing an energy treating process on the energy removable layer to transform portions of the energy removable layer into treated portions, and removing the treated portions such that portions of the energy removable layer remain on the opposite sidewalls of each of the first mask patterns. In an embodiment, the target layer is partially exposed after the treated portions of the energy removable layer are removed.

In another embodiment of the present disclosure, a method for preparing a semiconductor device structure is provided. The method includes forming a target layer over a semiconductor substrate, and forming a plurality of first mask patterns over the target layer. The method also includes forming a lining layer conformally covering the first mask patterns and the target layer. A first opening is formed over the lining layer and between the first mask patterns. The method further includes filling the first opening with a second mask pattern, and performing an etching process on the lining layer and the target layer using the first mask patterns and the second mask pattern as a mask such that a plurality of second openings are formed in the target layer.

In an embodiment, the first mask patterns are in direct contact with the target layer, and the second mask pattern is separated from the target layer by the lining layer. In an embodiment, the second mask patterns are separated from the first mask patterns by the lining layer. In an embodiment, the lining layer includes an organic polymer material. In an embodiment, a top surface of the second mask pattern is higher than top surfaces of the first mask patterns. In an embodiment, a top surface of the second mask pattern is substantially coplanar with a top surface of the lining layer before the etching process is performed. In an embodiment, the etching process includes a dry etching process.

In an embodiment, during the etching process, the first mask patterns have a first etching rate, the second mask pattern has a second etching rate, and the lining layer has a third etching rate greater than each of the first etching rate and the second etching rate. In an embodiment, a third opening between two adjacent first mask patterns of the first mask patterns has a first width, and each of the second openings in the target layer has a second width less than the first width. In an embodiment, a remaining portion of the lining layer is sandwiched between the second mask pattern and the target layer after the etching process is performed. In an embodiment, the remaining portion of the lining layer, the first mask patterns, and the second mask pattern are removed after the second openings are formed in the target layer.

Embodiments of a method for preparing a semiconductor device structure are provided in the disclosure. The method includes forming a plurality of first mask patterns over a target layer, and forming a plurality of energy removable spacers on opposite sidewalls of each of the first mask patterns. The method also includes forming a second mask pattern over the target layer and between the energy removable spacers, and removing the energy removable spacers. In some embodiments, the target layer is etched using the first mask patterns and the second mask pattern as a mask. As a result, the semiconductor device structure having a target layer with fine-pitch patterns can be obtained.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
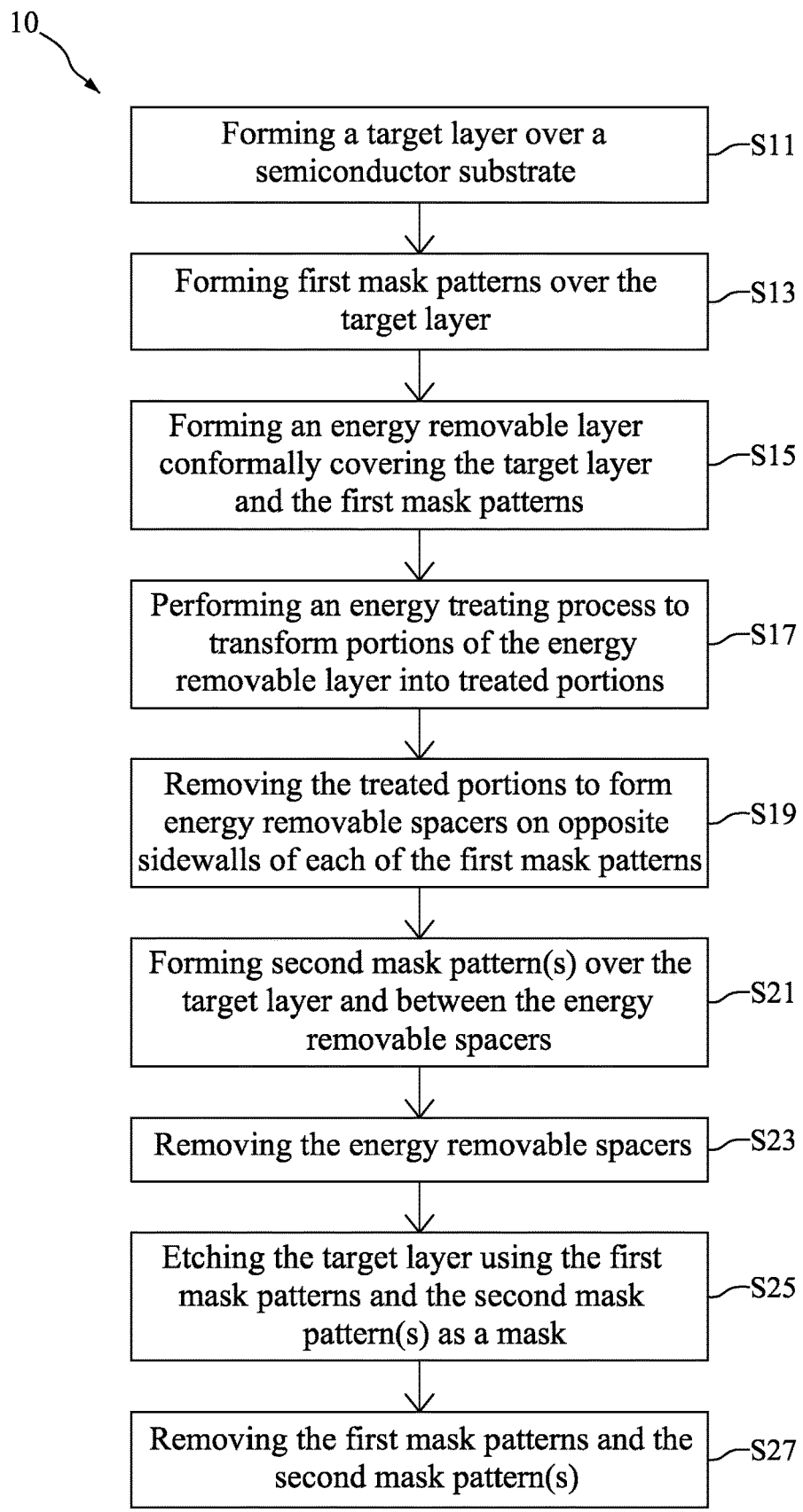
FIG. 1 is a flow diagram illustrating a method for preparing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method 10 for preparing a semiconductor device structure 100, and the method 10 includes steps S11, S13, S15, S17, S19, S21, S23, S25 and S27, in accordance with some embodiments. The steps S11 to S27 of FIG. 1 are first introduced briefly and then elaborated in connection with FIGS. 3-13. As shown in FIG. 1, the method 10 begins at step S11 where a target layer is formed over a semiconductor substrate.

Next, at step S13, first mask patterns are formed over the target layer. In some embodiments, the first mask patterns are separated from each other with a first pitch between them. At step S15, an energy removable layer is formed conformally covering the target layer and the first mask patterns. In some embodiments, the energy removable layer includes a cross-linking compound having a cross-linking functional group. In some embodiments, the cross-linking functional group includes a double bond.

At step S17, an energy treating process is performed to transform portions of the energy removable layer into treated portions. In some embodiments, the horizontal portions of the energy removable layer are transformed into treated portions, while the vertical portions of the energy removable layer remain untreated. In some embodiments, the energy treating process is an electron-beam (e-beam) writing process. However, any other suitable process, such as an ion-beam writing process, may alternatively be utilized.

At step S19, the treated portions of the energy removable layer are removed, leaving the untreated portions of the energy removable layer on opposite sidewalls of each of the first mask patterns. In some embodiments, the untreated portions of the energy removable layer form energy removable spacers. In some embodiments, the target layer is partially exposed after the treated portions are removed.

Subsequently, at step S21, one or more second mask patterns are formed over the target layer and between the energy removable spacers. In some embodiments, the one or more second mask patterns and the first mask patterns are separated from each other. In some embodiments, the one or more second mask patterns are in direct contact with the target layer. At step S23, the energy removable spacers are removed. In some embodiments, the energy removable spacers are removed by a stripping process.

At step S25, the target layer is etched using the first mask patterns and the one or more second mask patterns as a mask. In some embodiments, the target layer is etched to form protruding portions extending upward from a base portion of the target layer. In some embodiments, the protruding portions of the etched target layer have a second pitch between them, and the second pitch is less than the first pitch between the first mask patterns. At step S27, the first mask patterns and the one or more second mask patterns are removed, and the semiconductor device structure 100 is obtained after the step S27.

Figure 2:
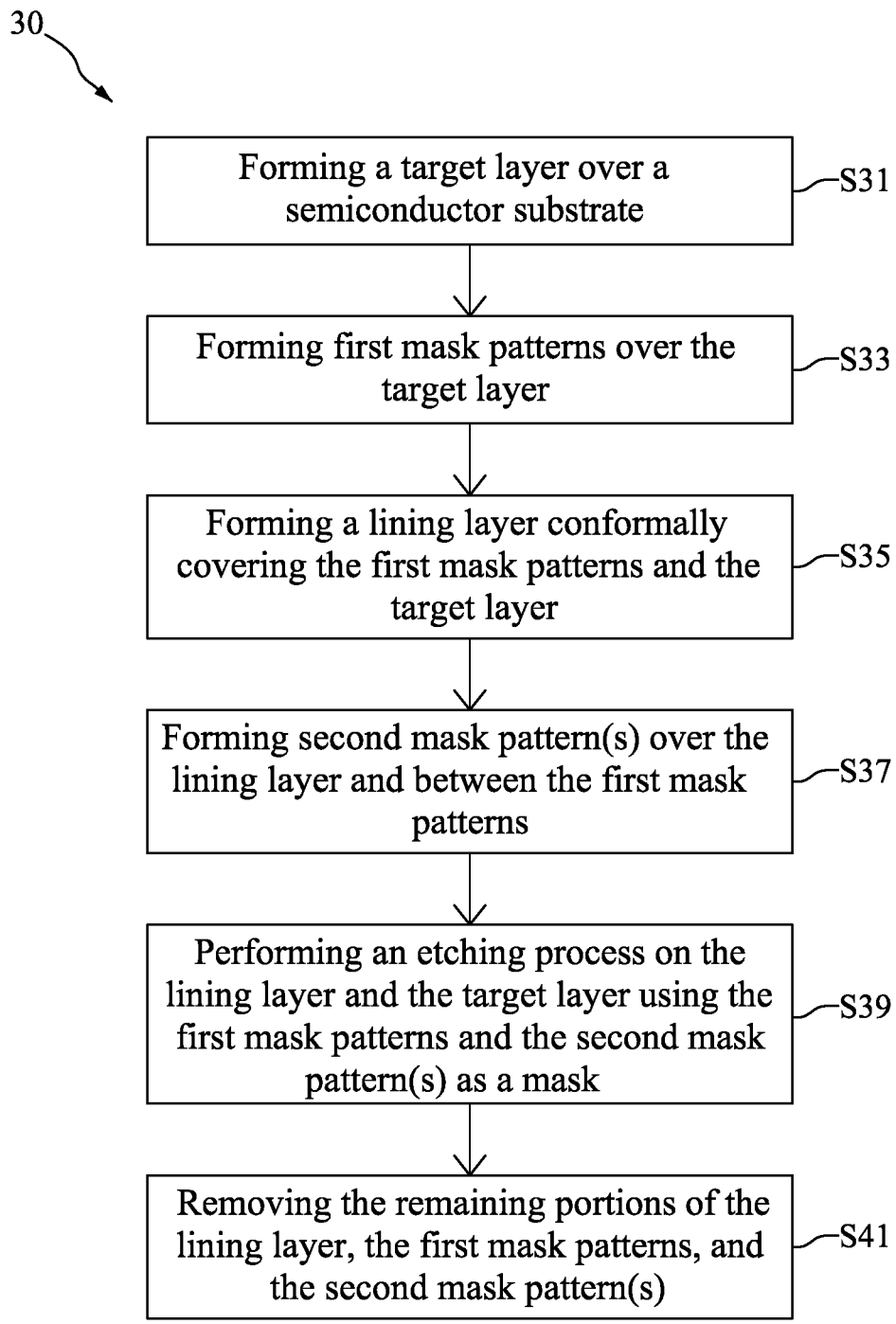
FIG. 2 is a flow diagram illustrating a method for preparing a semiconductor device structure, in accordance with some embodiments.

FIG. 2 is a flow diagram illustrating a method 30 for preparing the semiconductor device structure 100, and the method 30 includes steps S31, S33, S35, S37, S39 and S41, in accordance with some embodiments. The steps S31 to S41 of FIG. 2 are first introduced briefly and then elaborated in connection with FIGS. 14-20. The steps S31 and S33 are similar to the steps S11 and S13 of FIG. 1. In some embodiments, the first mask patterns are separated from each other with a first pitch between them.

After the first mask patterns are formed, at step S35, a lining layer is formed conformally covering the first mask patterns and the target layer. In some embodiments, the lining layer includes an organic polymer material. At step S37, one or more second mask patterns are formed over the lining layer and between the first mask patterns. In some embodiments, the first mask patterns are in direct contact with the target layer, while the one or more second mask patterns are separated from the target layer by the lining layer. In some embodiments, the top surface of each of the second mask patterns is higher than the top surfaces of the first mask patterns.

Next, at step S39, an etching process is performed on the lining layer and the target layer using the first mask patterns and the one or more second mask patterns as a mask. In some embodiments, the etching process includes a dry etching process. In some embodiments, during the etching process, the lining layer has an etching rate greater than each of the etching rate of the first mask patterns and the etching rate of the one or more second mask patterns.

In some embodiments, the target layer is etched to form protruding portions extending upward from a base portion of the target layer. In some embodiments, the protruding portions of the etched target layer have a third pitch between them, and the third pitch is less than the first pitch between the first mask patterns. At step S41, the remaining portions of the lining layer, the first mask patterns, and the one or more second mask patterns are removed, and the semiconductor device structure 200 is obtained after the step S41.

Figure 3:
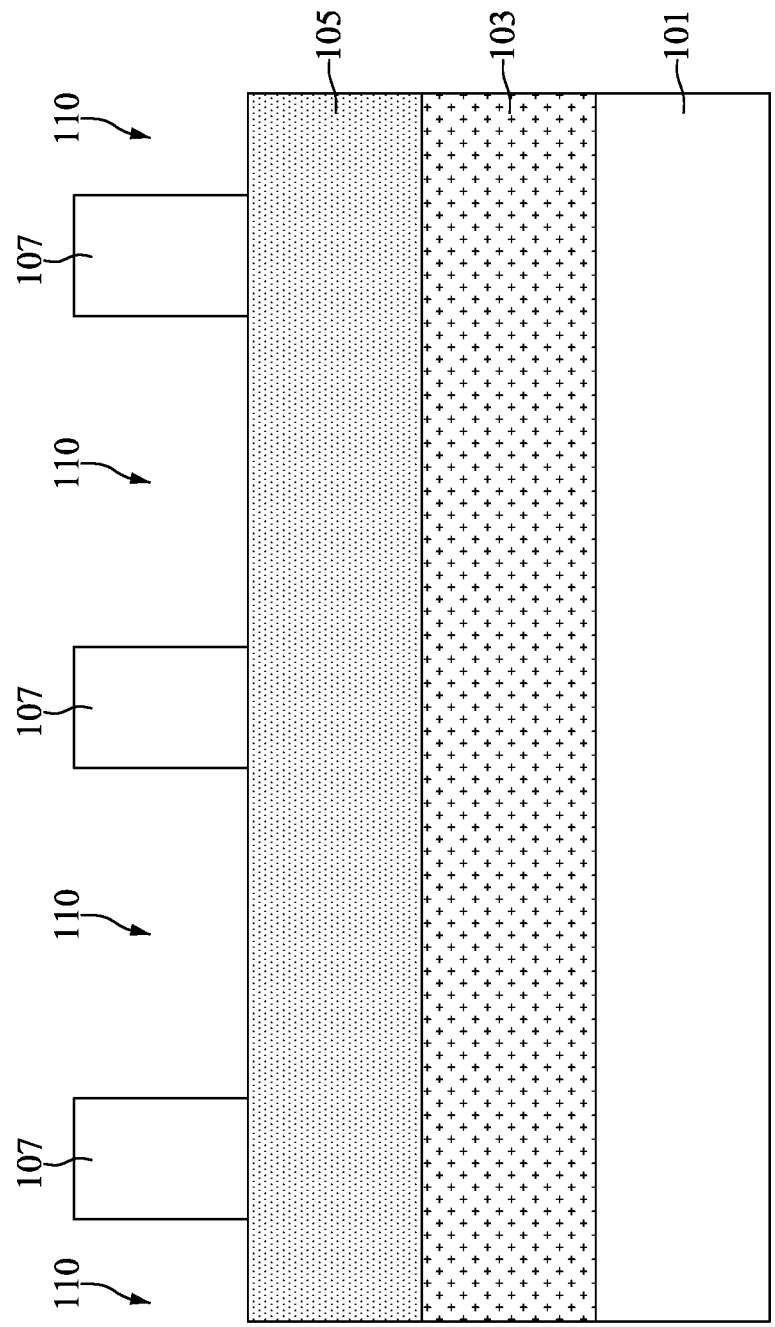
FIG. 3 is a cross-sectional view illustrating an intermediate stage of sequentially forming a target layer, a first mask layer, and a patterned mask over a semiconductor substrate during the formation of the semiconductor device structure, in accordance with some embodiments.

FIGS. 3-13 are cross-sectional views illustrating various stages of forming the semiconductor device structure 100 (FIG. 13) by the method 10 of FIG. 1, in accordance with some embodiments. As shown in FIG. 3, a target layer 103 is formed over a semiconductor substrate 101, in accordance with some embodiments. The respective step is illustrated as the step S11 in the method 10 shown in FIG. 1.

The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In some embodiments, the target layer 103 includes a dielectric material, such as silicon oxide, silicon nitride, silicon oxynitride, a low-k dielectric material or another suitable material. However, any suitable materials may be utilized. In some embodiments, the target layer 103 is formed by a deposition process, such as a chemical vapor deposition (CVD) process, a physical vapor deposition (PVD) process, an atomic layer deposition (ALD) process, a spin-on coating process, or another suitable method.

Still referring to FIG. 3, a first mask layer 105 is formed over the target layer 103, and a patterned hard mask 107 with openings 110 is formed over the first mask layer 105, in accordance with some embodiments. Some materials and processes used to form the first mask layer 105 may be similar to, or the same as, those used to form the target layer 103 and are not repeated herein. In some embodiments, the first mask layer 105 and the target layer 103 include different materials so that the etching selectivities may be different in the subsequent one or more etching processes.

In addition, the patterned hard mask 107 may be formed by a procedure including deposition and patterning. In some embodiments, the patterned hard mask 107 includes openings 110 exposing the first mask layer 105, and the patterned hard mask 107 functions as a mask for a subsequent etching process. In some embodiments, the patterned hard mask 107 includes silicon oxide, silicon nitride, silicon oxynitride, silicon oxycarbide, silicon carbon nitride, metal oxide, or another suitable material. In some embodiments, the patterned hard mask 107 is selected to have a lower etch rate than the first mask layer 105.

Figure 4:
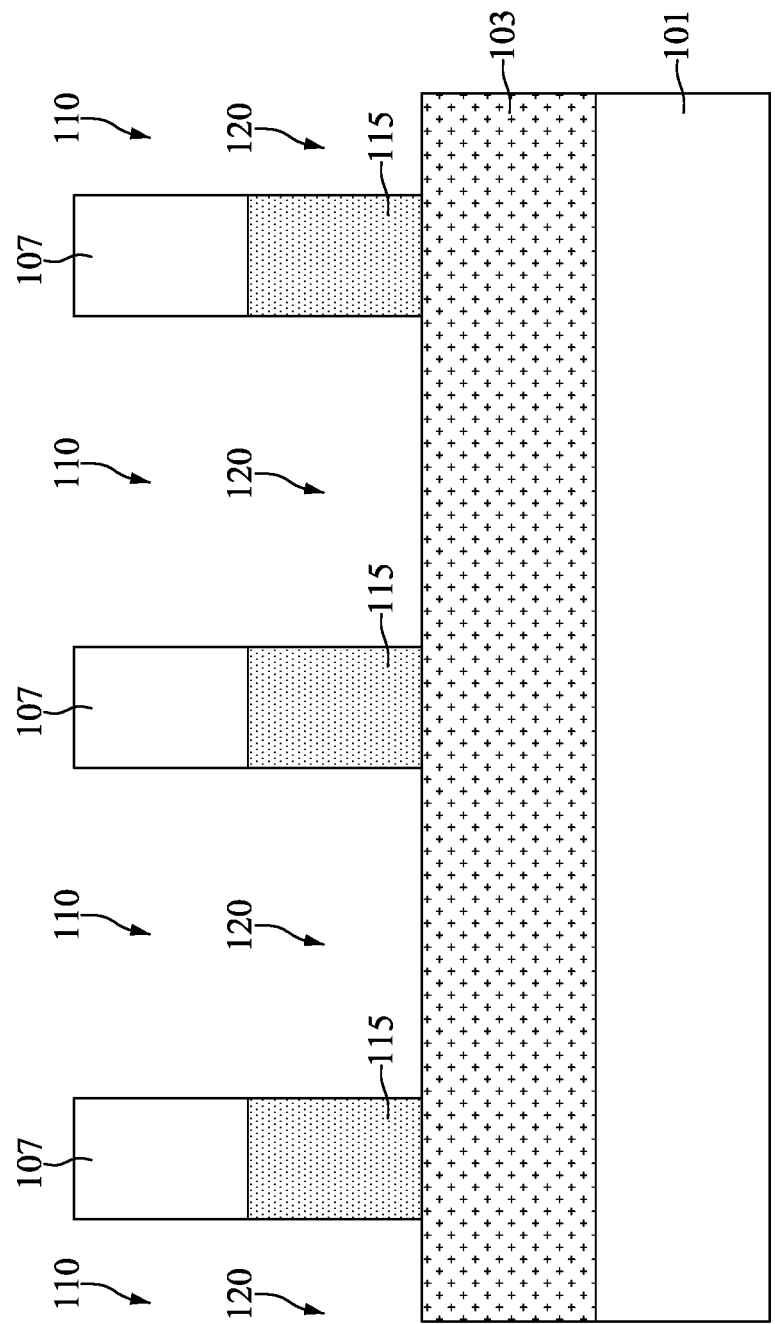
FIG. 4 is a cross-sectional view illustrating an intermediate stage of etching the first mask layer using the patterned mask as a mask such that first mask patterns are formed, in accordance with some embodiments.

Subsequently, an etching process is performed on the first mask layer 105 using the patterned hard mask 107 as a mask, such that first mask patterns 115 and openings 120 are formed, as shown in FIG. 4 in accordance with some embodiments. The respective step is illustrated as the step S13 in the method 10 shown in FIG. 1. In some embodiments, the first mask patterns 115 are separated from each other by the openings 120, and the target layer 103 is exposed by the openings 120. The etching process may be a wet etching process, a dry etching process, or a combination thereof.

Figure 5:
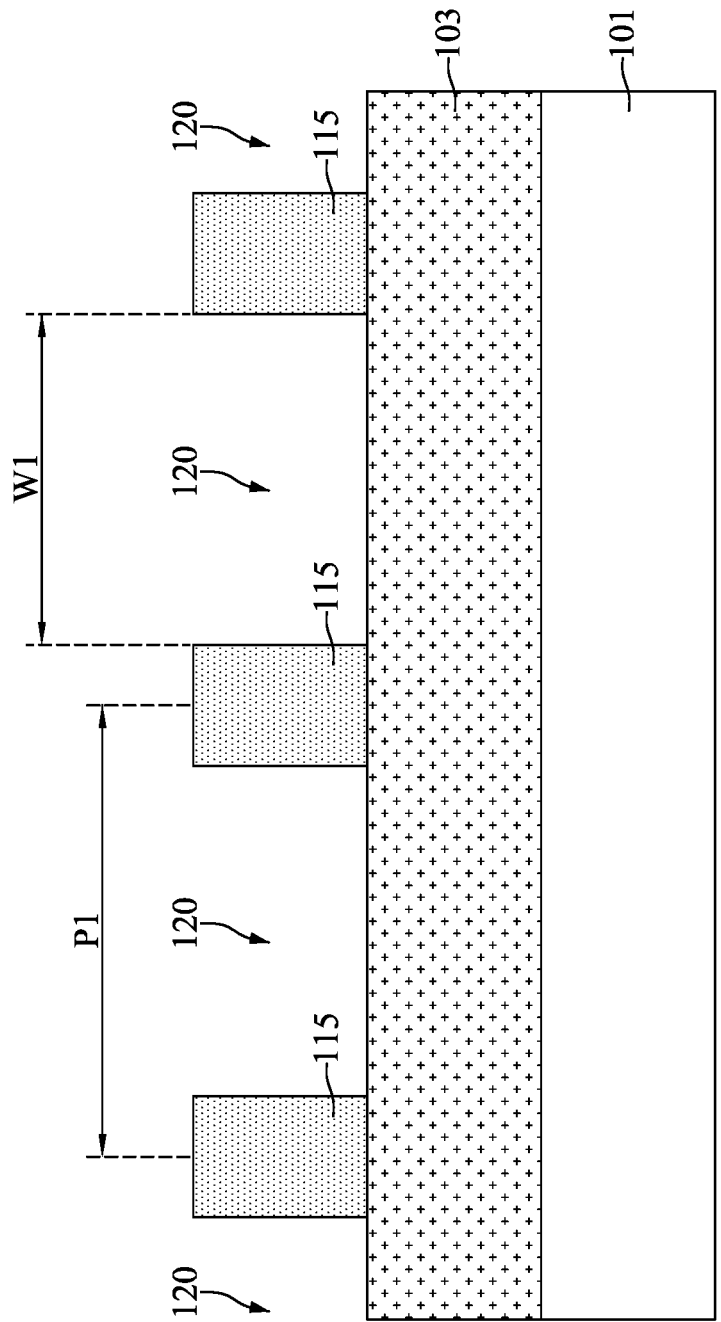
FIG. 5 is a cross-sectional view illustrating an intermediate stage of removing the patterned mask, in accordance with some embodiments.

After the openings 120 are formed between the first mask patterns 115, the patterned hard mask 107 is removed, as shown in FIG. 5 in accordance with some embodiments. In some embodiments, the patterned hard mask 107 is removed by a stripping process, an ashing process, an etching process, or another suitable process. In some embodiments, any two adjacent first mask patterns 115 have a first pitch P1 between them. In some embodiments, each of the openings 120 has a first width W1.

Figure 6:
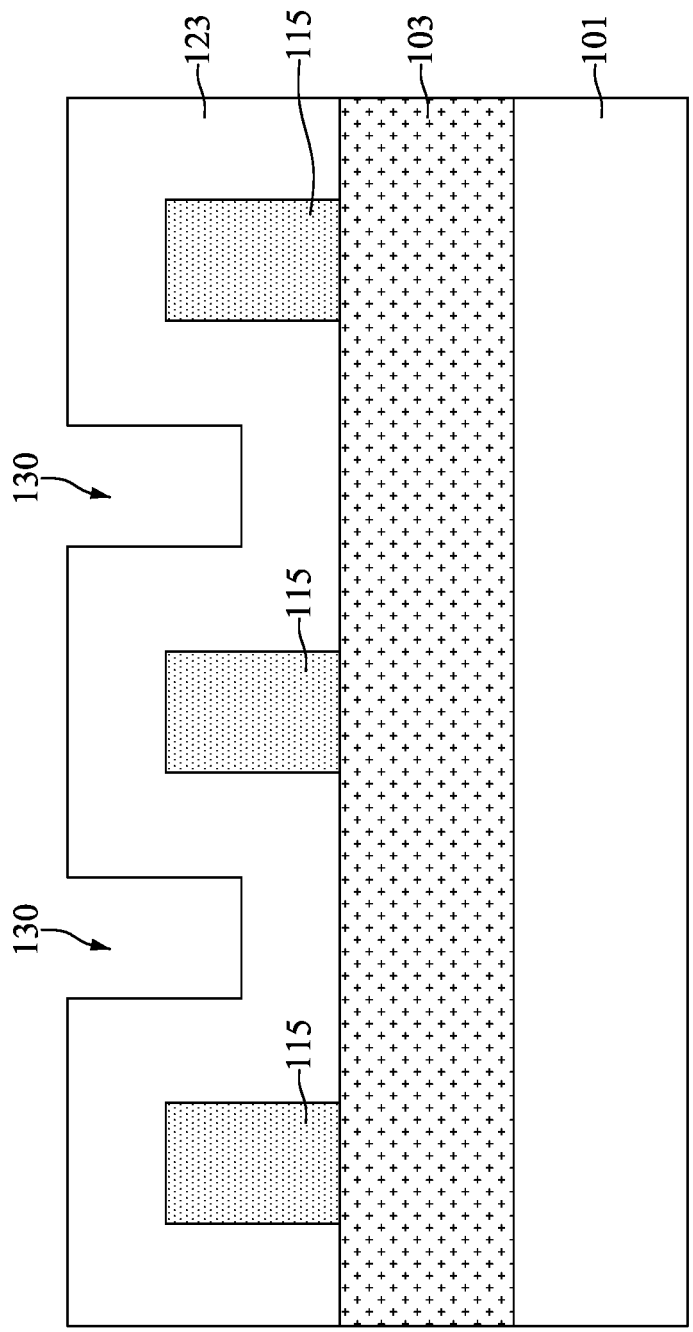
FIG. 6 is a cross-sectional view illustrating an intermediate stage of forming an energy removable layer conformally covering the first mask patterns and the target layer, in accordance with some embodiments.

Then, an energy removable layer 123 is formed conformally covering the first mask patterns 115 and the target layer 103, as shown in FIG. 6 in accordance with some embodiments. The respective step is illustrated as the step S15 in the method 10 shown in FIG. 1. In some embodiments, openings 130 are formed over the energy removable layer 123 and between the first mask patterns 115.

In some embodiments, the energy removable layer 123 includes a cross-linking compound having a cross-linking functional group. In some embodiments, the cross-linking functional group includes a double bond. In some embodiments, the cross-linking compound has a hydrogen-bonding group, a polymerizable diacetylene group, or a combination thereof. In some embodiments, the energy removable layer 123 is formed by a deposition process, such as a CVD process, a PVD process, an ALD process.

Figure 7:
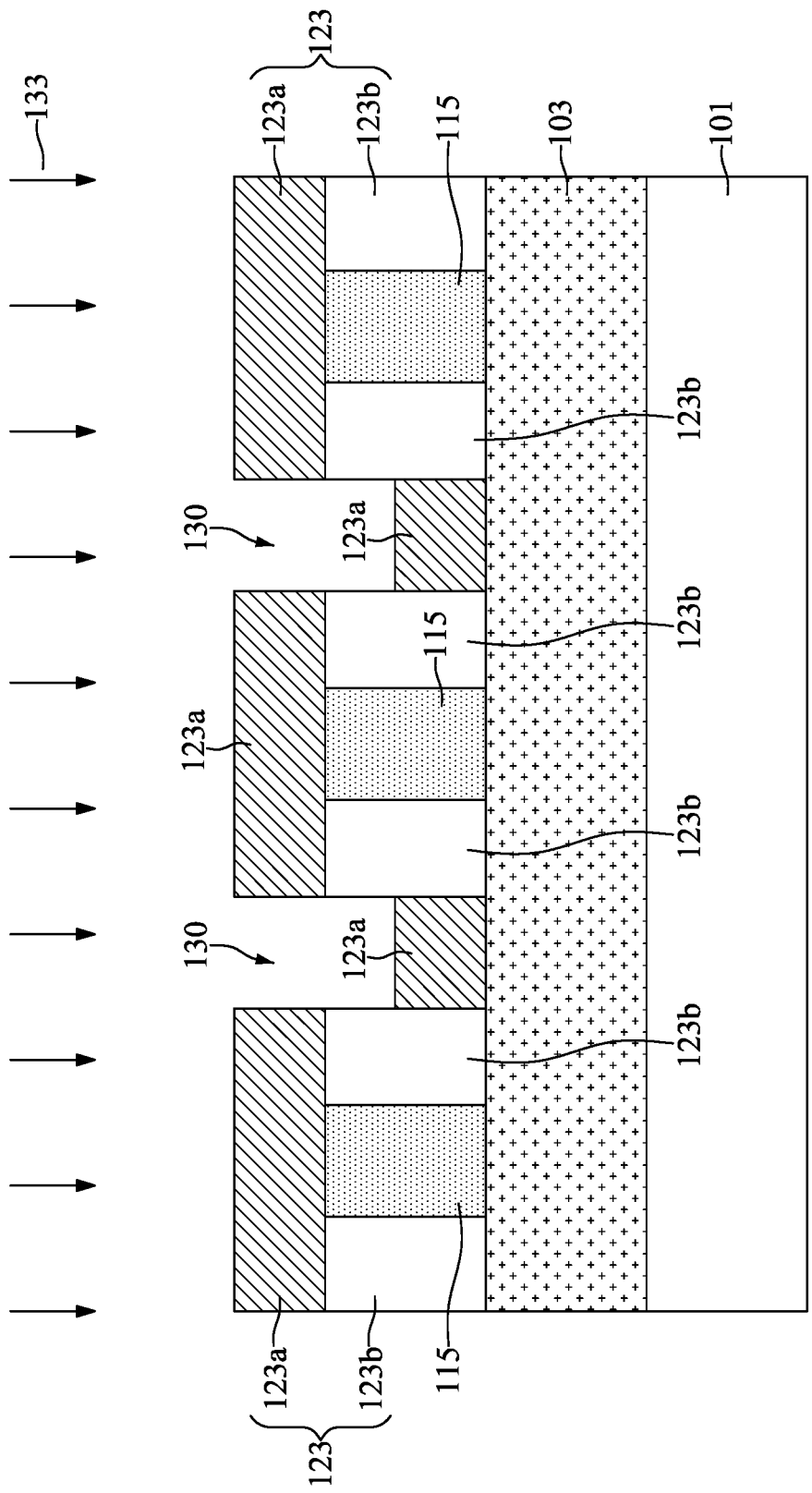
FIG. 7 is a cross-sectional view illustrating an intermediate stage of performing an energy treating process to transform portions of the energy removable layer into treated portions, in accordance with some embodiments.

Next, an energy treating process 133 is performed to form treated portions 123a in the energy removable layer 123, as shown in FIG. 7 in accordance with some embodiments. The respective step is illustrated as the step S17 in the method 10 shown in FIG. 1. In some embodiments, the horizontal portions of the energy removable layer 123 are transformed into the treated portions 123a, while the vertical portions of the energy removable layer 123 remain untreated (i.e., untreated portions 123b). In some embodiments, the energy treating process is an e-beam writing process. However, any other suitable process, such as an ion-beam writing process, may alternatively be utilized.

Figure 8:
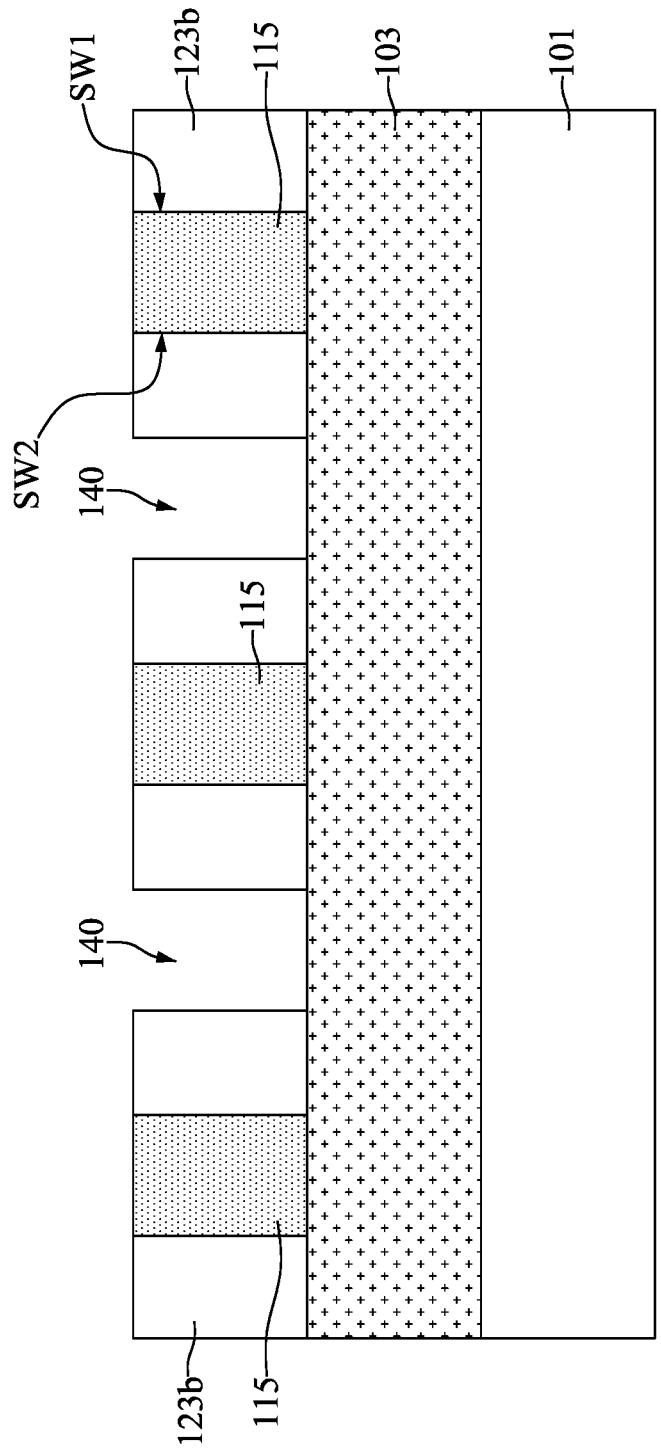
FIG. 8 is a cross-sectional view illustrating an intermediate stage of removing the treated portions to form energy removable spacers on opposite sidewalls of each of the first mask patterns, in accordance with some embodiments.

After the energy treating process is performed, the treated portions 123a are removed to form energy removable spacers 123b (i.e., the untreated portions 123b) on opposite sidewalls SW1 of each of the first mask patterns 115, as shown in FIG. 8 in accordance with some embodiments. The respective step is illustrated as the step S19 in the method 10 shown in FIG. 1. The treated portions 123a may be removed by a stripping process, an ashing process, an etching process, or another suitable process. After the treated portions 123a are removed, the target layer 103 is partially exposed by the openings 140 between the energy removable spacers 123b on sidewalls SW1 of adjacent first mask patterns 115, in accordance with some embodiments.

Figure 9:
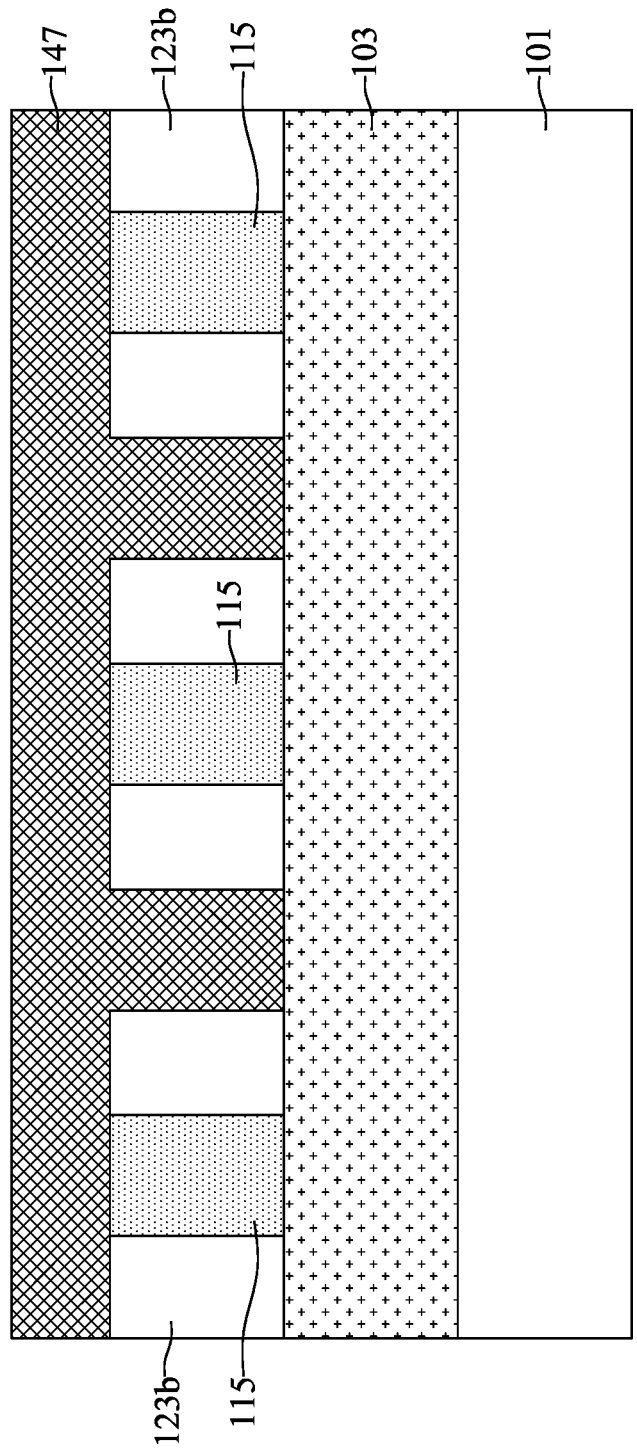
FIG. 9 is a cross-sectional view illustrating an intermediate stage of forming a second mask layer over the energy removable spacers and the first mask patterns, in accordance with some embodiments.

Subsequently, a second mask layer 147 is formed over the energy removable spacers 123b and the first mask patterns 115, as shown in FIG. 9 in accordance with some embodiments. In some embodiments, the openings 140 of FIG. 9 are filled by the second mask layer 147. Some materials used to form the second mask layer 147 may be similar to, or the same as, those used to form the first mask layer 105 of FIG. 3 and are not repeated herein. In some embodiments, the second mask layer 147 and the target layer 103 include different materials so that the etching selectivities may be different in the subsequent one or more etching processes. In some embodiments, the second mask layer 147 and the first mask patterns 115 include different materials.

Figure 10:
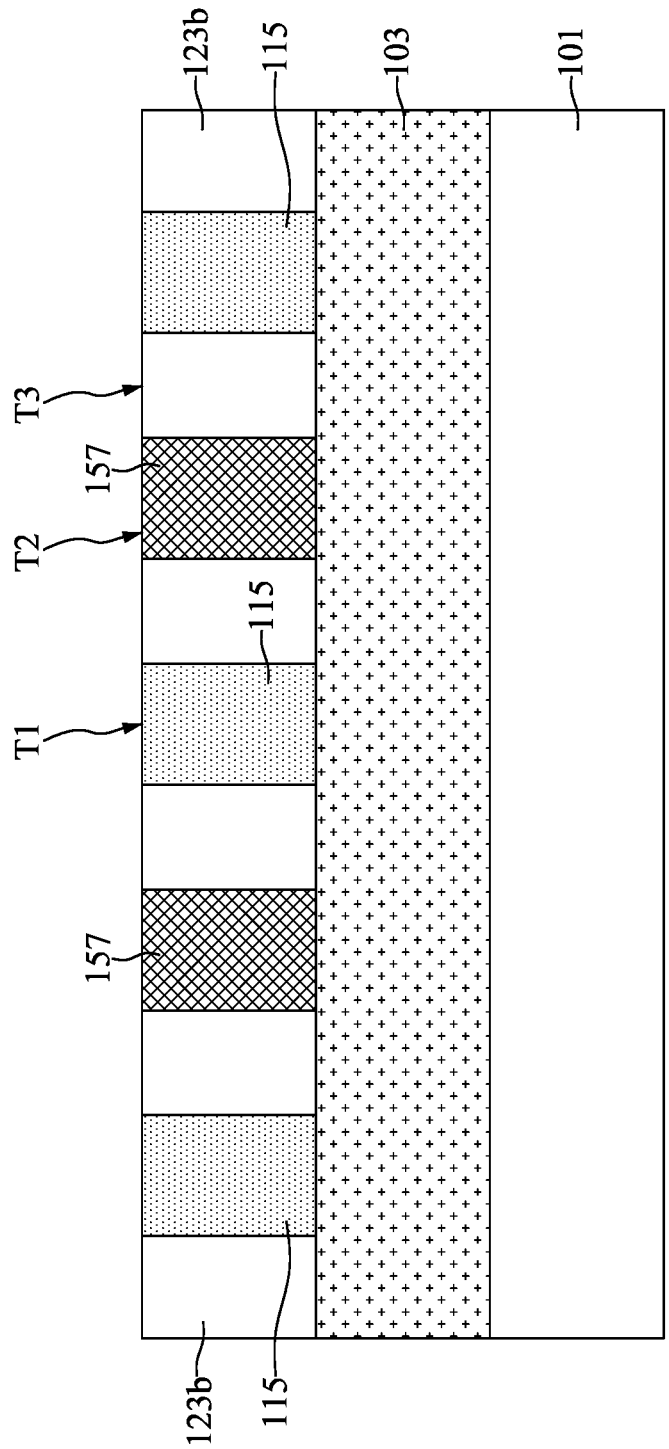
FIG. 10 is a cross-sectional view illustrating an intermediate stage of planarizing the second mask layer to form second mask patterns between the energy removable spacers, in accordance with some embodiments.

Then, a planarization process is performed on the second mask layer 147 to remove excess second mask layer 147 over the energy removable spacers 123b and the first mask patterns 115, such that second mask patterns 157 are formed in the openings 140 (see FIG. 8), as shown in FIG. 10 in accordance with some embodiments. The respective step is illustrated as the step S21 in the method 10 shown in FIG. 1. The planarization process may include a chemical mechanical polishing (CMP) process.

After the planarization process is performed, the top surfaces T1 of the first mask patterns 115, the top surfaces T2 of the second mask patterns 157, and the top surfaces T3 of the energy removable spacers 123b are substantially coplanar with each other. Within the context of this disclosure, the word "substantially" means preferably at least 90%, more preferably 95%, even more preferably 98%, and most preferably 99%. Although two second mask patterns 157 are shown as an example, however, the number of the second mask patterns 157 may be less than two or may be more than two, in accordance with some embodiments. In some embodiments, the number of the second mask patterns 157 depends on the number of the first mask patterns 115.

Figure 11:
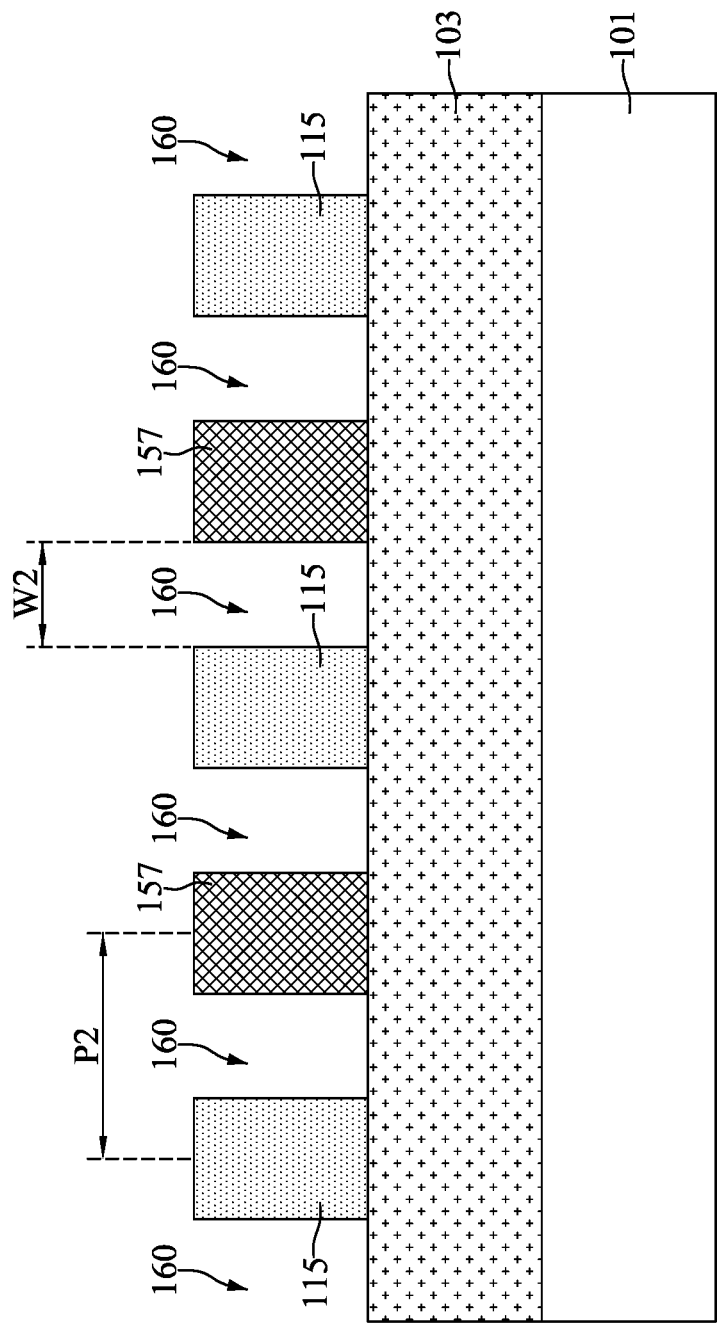
FIG. 11 is a cross-sectional view illustrating an intermediate stage of removing the energy removable spacers, in accordance with some embodiments.

Next, the energy removable spacers 123b are removed, as shown in FIG. 11 in accordance with some embodiments. The respective step is illustrated as the step S23 in the method 10 shown in FIG. 1. In some embodiments, the energy removable spacers 123b are removed by a stripping process. However, any other suitable process, such as an etching process, may alternatively be utilized.

After the energy removable spacers 123b are removed, the target layer 103 is partially exposed by openings 160, in accordance with some embodiments. In some embodiments, the second mask patterns 157 and the adjacent first mask patterns 115 have a second pitch P2 between them. In some embodiments, the second pitch P2 is less than the first pitch P1 between any two adjacent first mask patterns 115. Moreover, in some embodiments, each of the openings 160 has a second width W2. In some embodiments, the second width W2 is less than the first width W1 of the openings 120 between the first mask patterns 115 shown in FIG. 5.

Figure 12:
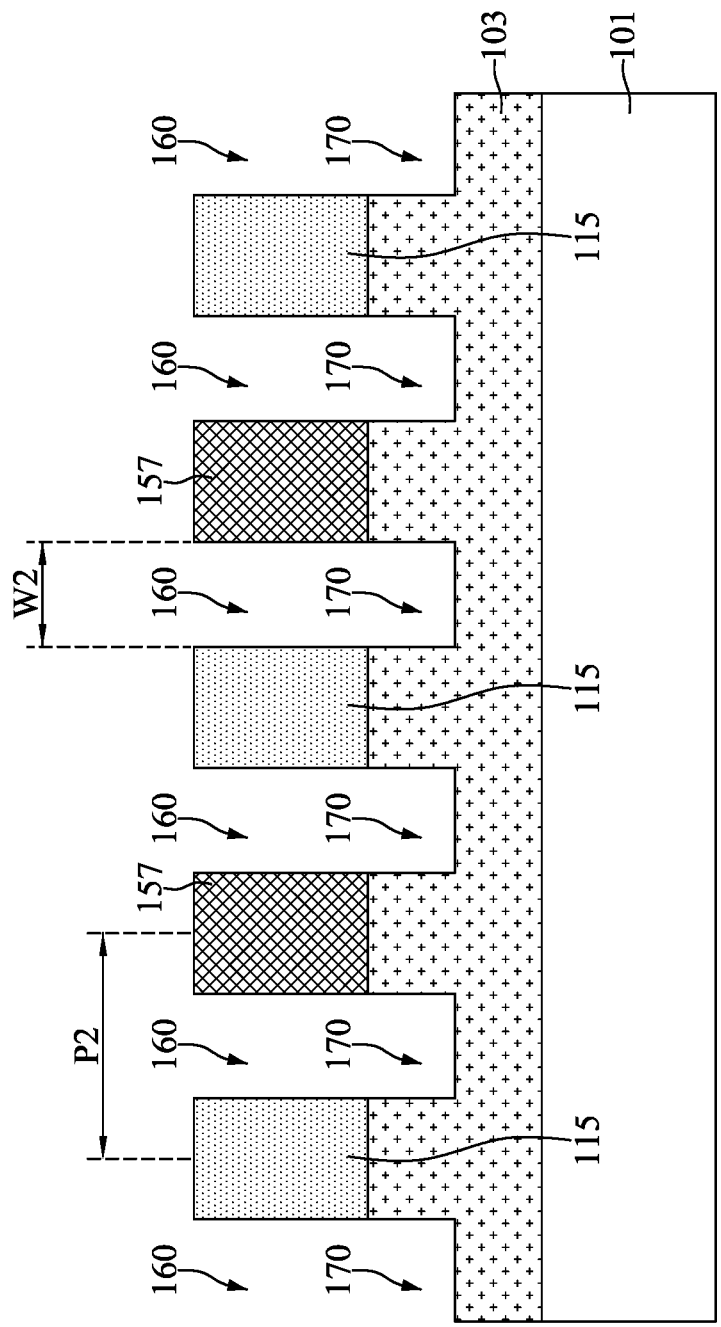
FIG. 12 is a cross-sectional view illustrating an intermediate stage of etching the target layer using the first mask patterns and the second mask patterns as a mask, in accordance with some embodiments.

Subsequently, the target layer 103 is etched using the first mask patterns 115 and the second mask patterns 157 as a mask, such that openings 170 are formed in the target layer 103, as shown in FIG. 12 in accordance with some embodiments. The respective step is illustrated as the step S25 in the method 10 shown in FIG. 1. In some embodiments, the target layer 103 is etched by a dry etching process. In some embodiments, the openings 170 are formed by deepening the openings 160.

Figure 13:
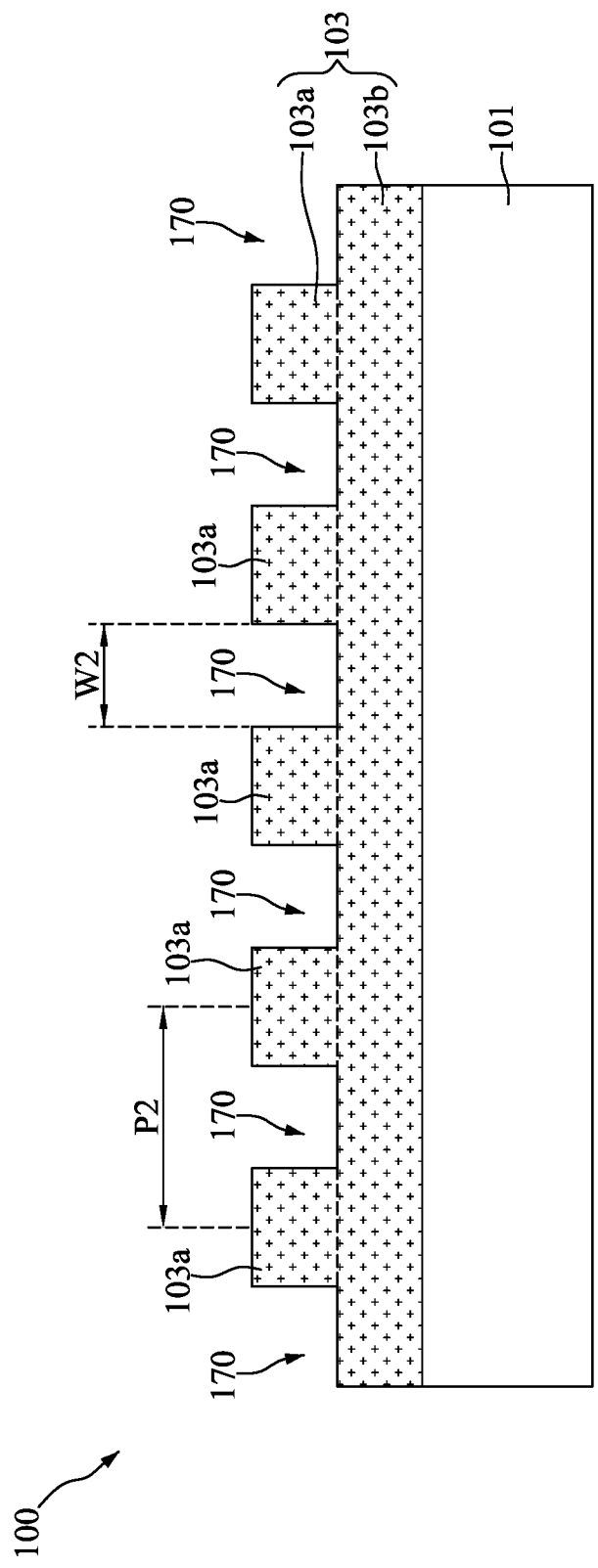
FIG. 13 is a cross-sectional view illustrating an intermediate stage of removing the first mask patterns and the second mask patterns, in accordance with some embodiments.

Then, the first mask patterns 115 and the second mask patterns 157 are removed, as shown in FIG. 13 in accordance with some embodiments. The respective step is illustrated as the step S27 in the method 10 shown in FIG. 1. In some embodiments, the first mask patterns 115 and the second mask patterns 157 are removed by one or more stripping processes, ashing processes, etching processes, or another suitable processes.

In some embodiments, the target layer 103 is etched to form protruding portions 103a extending upward from a base portion 103b of the target layer 103. In some embodiments, two adjacent protruding portions 103a of the target layer 103 have a second pitch P2 between them, which is substantially the same as the pitch between the second mask patterns 157 and the first mask patterns 115, and the second pitch P2 is less than the first pitch P1 between the first mask patterns 115. As a result, the semiconductor device structure 100 with fine-pitch patterns can be obtained.

Figure 14:
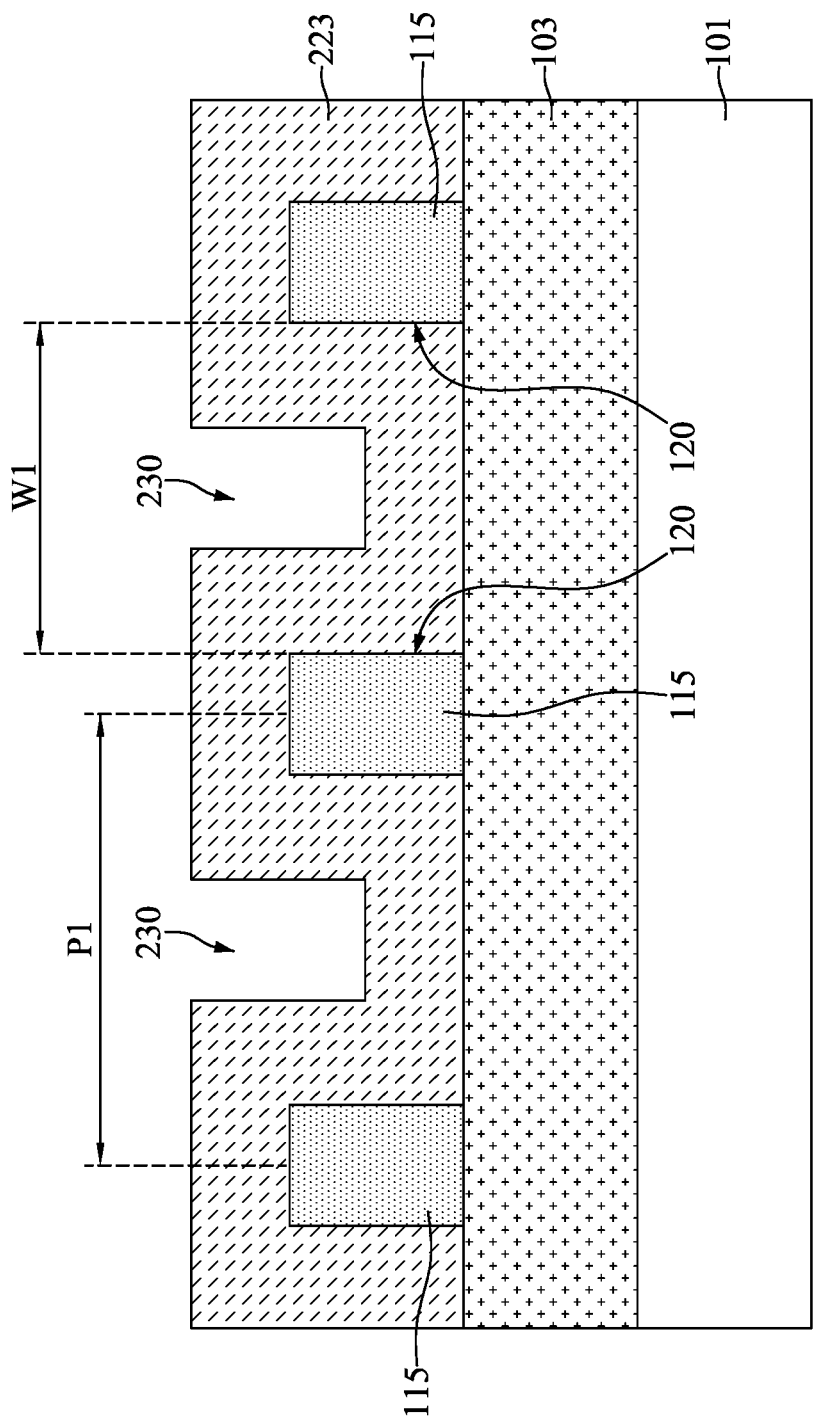
FIG. 14 is a cross-sectional view illustrating an intermediate stage of forming a lining layer conformally covering the first mask patterns and the target layer, in accordance with some embodiments.

FIGS. 14-20 are cross-sectional views illustrating various stages of forming the semiconductor device structure 200 (FIG. 20) by the method 30 of FIG. 2, in accordance with some embodiments. As shown in FIG. 14, after the target layer 103 and the first mask patterns 115 are formed (corresponding to the steps S31 and S33 of FIG. 2, and the details have been discussed in the embodiments referring to FIGS. 3-5), a lining layer 223 is formed conformally covering the first mask patterns 115 and the target layer 103, in accordance with some embodiments. The respective step is illustrated as the step S35 in the method 30 shown in FIG. 2.

In some embodiments, openings 230 are formed over the lining layer 223 and between the first mask patterns 115. In some embodiments, the lining layer 223 includes an organic polymer material, such as resin, benzocyclobutene (BCB), or another suitable material. In some embodiments, the lining layer 223 is formed by a deposition process, such as a CVD process, a PVD process, an ALD process, or another suitable method. In addition, as mentioned above, any two adjacent first mask patterns 115 have a first pitch P1 between them, and each of the openings 120 between two adjacent first mask patterns 115 has a first width W1.

Figure 15:
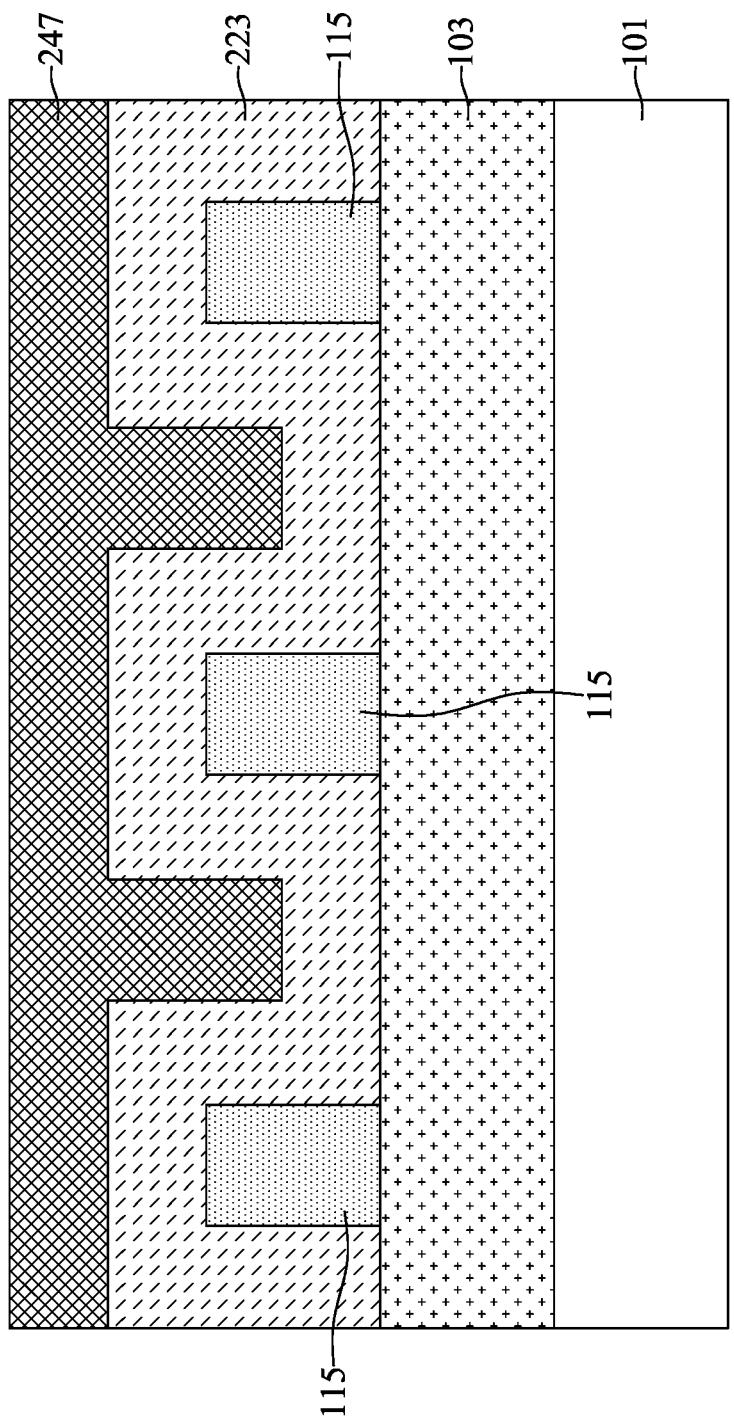
FIG. 15 is a cross-sectional view illustrating an intermediate stage of forming a second mask layer over the lining layer, in accordance with some embodiments.

Next, a second mask layer 247 is formed over the lining layer 223, as shown in FIG. 15 in accordance with some embodiments. In some embodiments, the openings 230 of FIG. 14 are filled by the second mask layer 247. Some materials used to form the second mask layer 247 may be similar to, or the same as, those used to form the first mask layer 105 of FIG. 3 and are not repeated herein. In some embodiments, the second mask layer 247 and the target layer 103 include different materials so that the etching selectivities may be different in the subsequent one or more etching processes. In some embodiments, the second mask layer 247 and the first mask patterns 115 include different materials.

Figure 16:
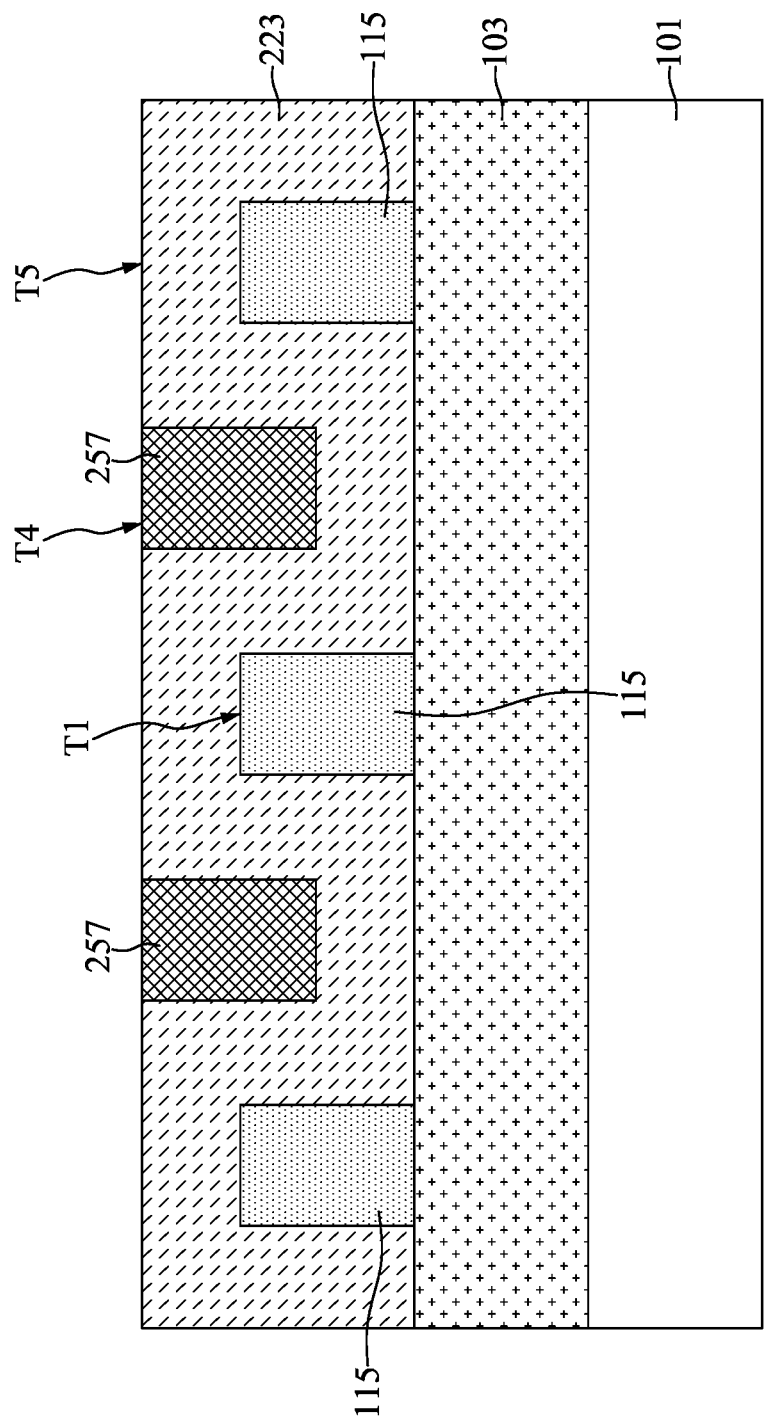
FIG. 16 is a cross-sectional view illustrating an intermediate stage of planarizing the second mask layer to form second mask patterns between the first mask patterns, in accordance with some embodiments.

Then, a planarization process is performed on the second mask layer 247 to remove excess second mask layer 247 over the lining layer 223, such that second mask patterns 257 are formed in the openings 230 (see FIG. 14), as shown in FIG. 16 in accordance with some embodiments. In some embodiments, each of the second mask patterns 257 are form over the lining layer 223 and between two adjacent first mask patterns 115. The respective step is illustrated as the step S37 in the method 30 shown in FIG. 2. The planarization process may include a CMP process.

After the planarization process is performed, the top surfaces T4 of the second mask patterns 257 are substantially coplanar with the top surfaces T5 of the lining layer 223, and both of the top surfaces T4 and T5 are higher than the top surfaces T1 of the first mask patterns 115. Although two second mask patterns 257 are shown as an example, however, the number of the second mask patterns 257 may be less than two or may be more than two, in accordance with some embodiments. In some embodiments, the number of the second mask patterns 257 depends on the number of the first mask patterns 115.

Figure 17:
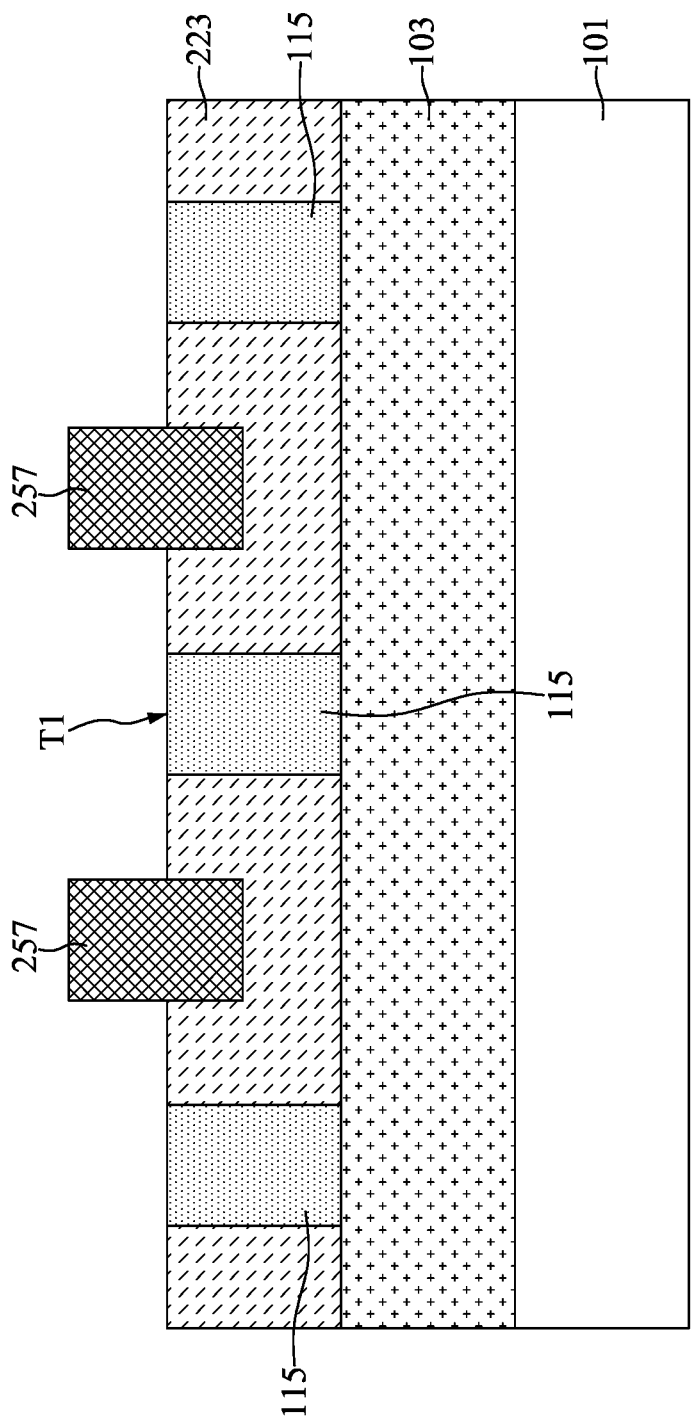
FIGS. 17-19 are cross-sectional views illustrating intermediate stages of performing an etching process on the lining layer and the target layer using the first mask patterns and the second mask patterns as a mask, in accordance with some embodiments.
Figure 18:
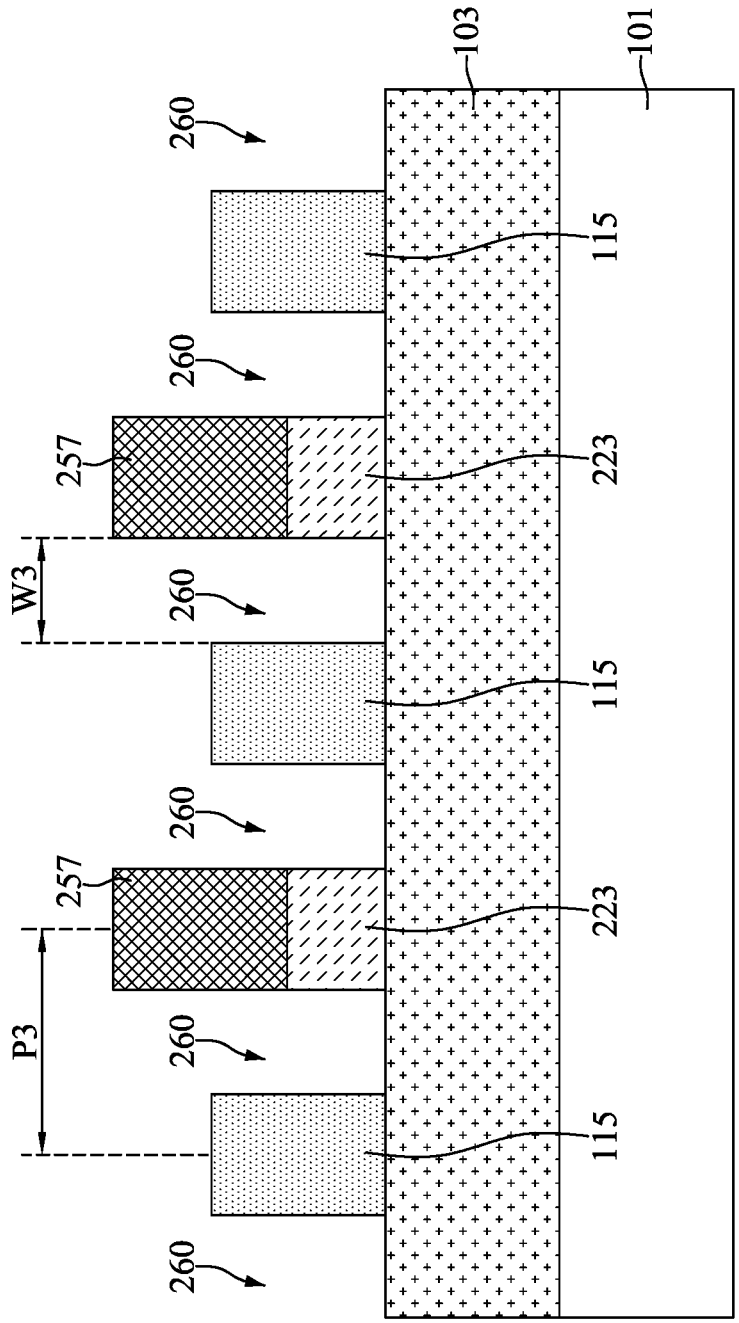
Figure 19:
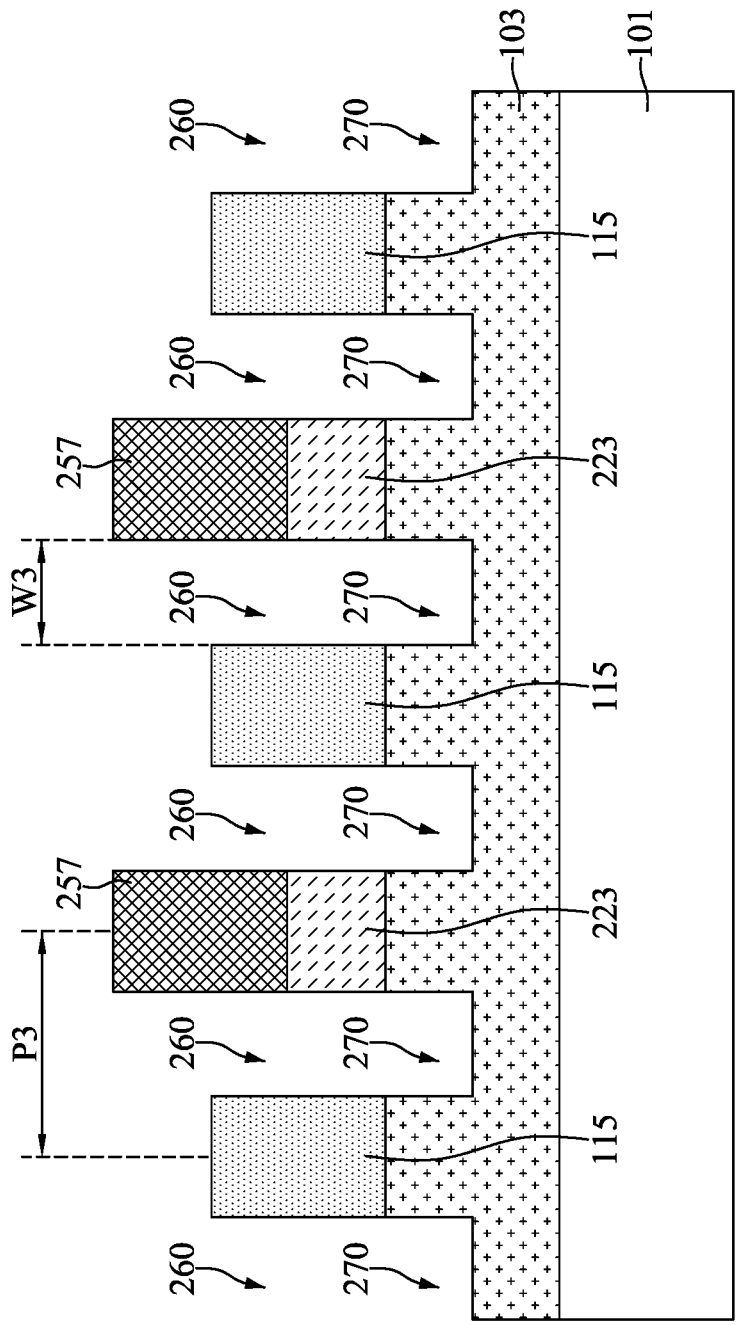

Next, an etching process is performed on the lining layer 223 and the target layer 103 using the first mask patterns 115 and the second mask patterns 257 as a mask, such that openings 270 are formed in the target layer 103, as shown in FIGS. 17-19 in accordance with some embodiments. The respective step is illustrated as the step S39 in the method 30 shown in FIG. 2. In some embodiments, the target layer 103 is etched by a dry etching process.

FIGS. 17-19 respectively show different stages in the etching process, in accordance with some embodiments. In some embodiments, during the etching process, the etching rate of the lining layer 223 is greater than each of the etching rate of the first mask patterns 115 and the etching rate of the second mask patterns 257.

As shown in FIG. 17, during the first stage of the etching process, the etching rate of the lining layer 223 is higher than the etching rate of the second mask patterns 257. Therefore, the second mask patterns 257 can be an etching mask preventing the underlying portions of the lining layer 223 from being etched, while the portions of the lining layer 223 above the first mask patterns 115 are etched to expose the first mask patterns 115.

Subsequently, during the second stage of the etching process, since the etching rate of the lining layer 223 is higher than the etching rate of the first mask patterns 115, portions of the lining layer 223 between each pair of adjacent first mask patterns 115 and second mask patterns 257 are etched to form openings 260 exposing underlying target layer 103, while the first mask patterns 115 are substantially unetched, as shown in FIG. 18 in accordance with some embodiments. In addition, each of the openings 260 has a third width W3. In some embodiments, the third width W3 is less than the first width W1 of the openings 120 between the first mask patterns 115 shown in FIG. 14.

Then, during the final stage of the etching process, the openings 260 are deepened to form openings 270 in the target layer 103, as shown in FIG. 19 in accordance with some embodiments. In some embodiments, the remaining portions of the lining layer 223 are sandwiched between the second mask patterns 257 and the target layer 103.

Figure 20:
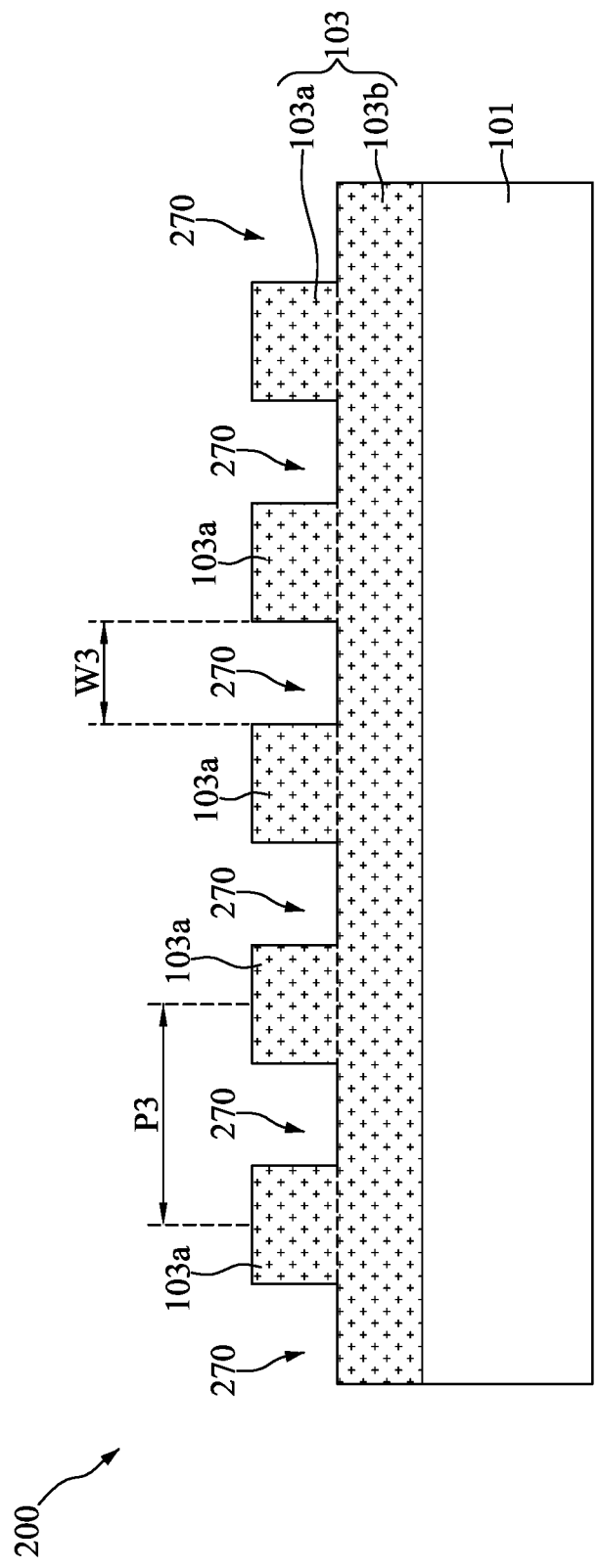
FIG. 20 is a cross-sectional view illustrating an intermediate stage of removing the remaining portions of the lining layer, the first mask patterns, and the second mask patterns, in accordance with some embodiments.

Next, the remaining portions of the lining layer 223, the first mask patterns 115, and the second mask patterns 257 are removed, as shown in FIG. 20 in accordance with some embodiments. The respective step is illustrated as the step S41 in the method 30 shown in FIG. 2. In some embodiments, the remaining portions of the lining layer 223, the first mask patterns 115, and the second mask patterns 257 are removed by one or more stripping processes, ashing processes, etching processes, or another suitable processes.

In some embodiments, the target layer 103 is etched to form protruding portions 103a extending upward from a base portion 103b of the target layer 103. In some embodiments, two adjacent protruding portions 103a of the target layer 103 have a third pitch P3 between them, which is substantially the same as the pitch between the second mask patterns 257 and the first mask patterns 115 (see FIGS. 18 and 19), and the third pitch P3 is less than the first pitch P1 between the first mask patterns 115. As a result, the semiconductor device structure 200 with fine-pitch patterns can be obtained.

Embodiments of the method for preparing a semiconductor device structure with fine-pitch patterns are provided in the disclosure. In some embodiments, the method includes forming first mask patterns (e.g., the first mask patterns 115) over a target layer (e.g., the target layer 103), and forming energy removable spacers (e.g., the energy removable spacers 123b) on opposite sidewalls of each of the first mask patterns. The method also includes forming second mask pattern(s) (e.g., the second mask patterns 157) over the target layer and between the energy removable spacers, and removing the energy removable spacers. In addition, the target layer is etched using the first mask patterns and the second mask pattern(s) as a mask, such that protruding portions (e.g., the protruding portions 103a) are formed extending upward from a base portion (e.g., the base portion 103b) of the target layer. In some embodiments, the pitch between the protruding portions of the target layer is less than the pitch between the first mask patterns (e.g., P2<P1), and the semiconductor device structure with fine-pitch patterns can be obtained.

In some other embodiments, the method includes forming first mask patterns over a target layer, and forming a lining layer (e.g., lining layer 223) covering the first mask patterns and the target layer. The method also includes forming second mask pattern(s) over the lining layer and between the first mask patterns, and performing an etching process on the lining layer and the target layer using the first mask patterns and the second mask pattern(s) as a mask, such that protruding portions are formed extending upward from a base portion of the target layer. In some embodiments, the pitch between the protruding portions of the target layer is less than the pitch between the first mask patterns (e.g., P3<P1), and the semiconductor device structure with fine-pitch patterns can be obtained.

In one embodiment of the present disclosure, a method for preparing a semiconductor device structure is provided. The method includes forming a target layer over a semiconductor substrate, and forming a plurality of first mask patterns over the target layer. The method also includes forming a plurality of energy removable spacers on opposite sidewalls of each of the first mask patterns, and forming a second mask pattern over the target layer and between the energy removable spacers. The method further includes removing the energy removable spacers, and etching the target layer using the first mask patterns and the second mask pattern as a mask.

In another embodiment of the present disclosure, a method for preparing a semiconductor device structure is provided. The method includes forming a target layer over a semiconductor substrate, and forming a plurality of first mask patterns over the target layer. The method also includes forming a lining layer conformally covering the first mask patterns and the target layer. A first opening is formed over the lining layer and between the first mask patterns. The method further includes filling the first opening with a second mask pattern, and performing an etching process on the lining layer and the target layer using the first mask patterns and the second mask pattern as a mask such that a plurality of second openings are formed in the target layer.

The embodiments of the present disclosure have some advantageous features. By etching the target layer using the first mask patterns and the second mask pattern(s) as a mask, the pitch between the protruding portions of the target layer is less than the pitch between the first mask patterns, and the semiconductor device structure with fine-pitch patterns can be obtained.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device structure, comprising:
    forming a target layer over a semiconductor substrate;
    forming a plurality of first mask patterns over the target layer;
    forming an energy removable layer on the target layer to entirely cover the first mask patterns, wherein the energy removable layer has a plurality of first openings alternating with the first mask patterns,
    via an electronic-beam writing process, forming a plurality of treated portions and a plurality of untreated portions, wherein horizontal portions of the energy removable layers are transformed into the treated portions while vertical portions of the energy removable layers remain untreated to form the untreated portions;
    removing the treated portions of the energy removable layer to form a plurality of second openings, wherein each of the second openings is formed between two adjacent untreated portions of the energy removable layer, wherein each of the second openings has a uniform width from top to bottom;
    forming a plurality of energy removable spacers on opposite sidewalls of each of the first mask patterns at a position that top surfaces of the first mask patterns are coplanar with top surfaces of the energy removable spacers, wherein the energy removable spacers are the untreated portions of the energy removable layer;
    forming a second mask layer over the first mask patterns and between the energy removable spacers within the second openings, wherein the second mask layer has an upper portion formed over and in contact with the top surface of the first mask pattern and a bottom portion formed between the energy removable spacers;
    via a planarization process, removing the upper portion of the second mask layer to form a second mask pattern as the bottom portion of the second mask layer between the energy removable spacers, wherein the top surfaces of the first mask patterns and the top surfaces of the energy removable spacers are exposed after the upper portion of the second mask layer is removed, wherein a top surface of the second mask pattern is coplanar with the top surfaces of the first mask patterns and the top surfaces of the energy removable spacers after the upper portion of the second mask layer is removed;

removing the energy removable spacers; and etching the target layer using the first mask patterns and the second mask pattern as a mask to form a plurality of openings indented from a top surface of the target layer toward a bottom surface thereof, wherein a bottom of each of the openings is formed above the bottom surface of the target layer;

wherein after the target layer is etched, the target layer has a base portion covering on the semiconductor substrate, and a plurality of protruding portions spaced apart from each other and extending upward from the base portion of the target layer.

2. The method for preparing a semiconductor device structure of claim 1, wherein the energy removable spacers are in direct contact with the target layer.

3. The method for preparing a semiconductor device structure of claim 1, wherein the energy removable spacers are in direct contact with the opposite sidewalls of each of the first mask patterns, wherein a height of each of the energy removable spacers is equal to a height of each of the first mask patterns, such that the top surfaces of the first mask patterns are coplanar with the top surfaces of the energy removable spacers.

4. The method for preparing a semiconductor device structure of claim 1, wherein the second mask pattern is in direct contact with the target layer, wherein a height of the second mask pattern is equal to a height of each of the first mask patterns, such that the top surface of the second mask pattern is coplanar with the top surfaces of the first mask patterns.

5. The method for preparing a semiconductor device structure of claim 1, wherein the second mask pattern is formed between the first mask patterns and in direct contact with the energy removable spacers, wherein the second mask pattern has a uniform width from top to bottom.

6. The method for preparing a semiconductor device structure of claim 1, wherein the second mask pattern is separated from the first mask patterns by the energy removable spacers.

7. The method for preparing a semiconductor device structure of claim 1, wherein top surfaces of the first mask patterns, the second mask pattern, and the energy removable spacers are substantially coplanar and are flat surfaces after the planarization process.

8. The method for preparing a semiconductor device structure of claim 1, wherein the energy removable spacers are removed after the second mask pattern is formed.

9. The method for preparing a semiconductor device structure of claim 1, wherein the target layer is etched after the energy removable spacers are removed.

10. The method for preparing a semiconductor device structure of claim 1, wherein the first mask patterns and the second mask pattern are removed after the target layer is etched.

11. The method for preparing a semiconductor device structure of claim 1, wherein a first pitch between the first mask patterns is greater than a second pitch between the protruding portions of the target layer.

12. The method for preparing a semiconductor device structure of claim 1, wherein the treated portions are removed by a stripping process, an ashing process, or an etching process.

13. The method for preparing a semiconductor device structure of claim 12, wherein the target layer is partially exposed through the second openings after the treated portions of the energy removable layer are removed.

14. The method for preparing a semiconductor device structure of claim 1, wherein a distance between two of the adjacent first mask patterns is less than a first pitch between two of the adjacent first mask patterns.

15. The method for preparing a semiconductor device structure of claim 1, wherein a second pitch between the first mask patterns and the second mask pattern is less than a pitch between two of the adjacent first mask patterns.

16. The method for preparing a semiconductor device structure of claim 1, wherein a second pitch between the first mask patterns and the second mask pattern is less than a second distance between the first mask patterns and the second mask pattern.

17. The method for preparing a semiconductor device structure of claim 1, wherein the upper portion of the second mask layer is in contact with the top surfaces of the first mask patterns and the top surfaces of the energy removable spacers before it is removed.

18. The method for preparing a semiconductor device structure of claim 1, wherein the upper portion of the second mask layer is removed by the planarization process until the top surface of the second mask pattern is coplanar with the top surfaces of the first mask patterns and the top surfaces of the energy removable spacers.

* * * * *